US012757364B2

(12) United States Patent
Osawa

(10) Patent No.: US 12,757,364 B2
(45) Date of Patent: Oct. 6, 2026

(54) SEMICONDUCTOR APPARATUS

(71) Applicant: FUJI ELECTRIC CO., LTD., Kawasaki (JP)

(72) Inventor: Akihiro Osawa, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 515 days.

(21) Appl. No.: 18/175,149

(22) Filed: Feb. 27, 2023

(65) Prior Publication Data

US 2024/0023299 A1 Jan. 18, 2024

(30) Foreign Application Priority Data

Apr. 15, 2022 (JP) ................................ 2022-067529

(51) Int. Cl.
*H05K 9/00* (2006.01)
*H10W 90/00* (2026.01)

(52) U.S. Cl.
CPC .......... *H05K 9/0024* (2013.01); *H10W 90/00* (2026.01)

(58) Field of Classification Search
CPC .. H05K 9/0024; H05K 9/0045; H05K 9/0081; H05K 7/14329; H05K 2201/10272; H01L 25/162; H01L 25/16; H01L 25/072; H01L 23/552; H01L 23/50; H01L 23/3121; H01L 2224/73265; H02M 1/44; H02M 7/003; H02M 7/5387; H02M 7/81; H02M 7/797
See application file for complete search history.

(56) References Cited

U.S. PATENT DOCUMENTS 6,304,448 B1 10/2001 Fukada et al.
2011/0221268 A1* 9/2011 Kanazawa ........... H05K 1/0263 361/775
2014/0184212 A1* 7/2014 Yamaguchi ........... H02M 7/003 324/244
2016/0181940 A1* 6/2016 Takahashi .............. H05K 9/002 361/752
2017/0194872 A1* 7/2017 Fukumasu ........... H05K 5/0026

FOREIGN PATENT DOCUMENTS

JP 2001250910 A 9/2001
JP 2004022705 A 1/2004
JP 2021141638 A 9/2021
WO 2018230012 A1 12/2018

OTHER PUBLICATIONS

Office Action issued for corresponding Japanese patent application JP2022-067529, and its English translation, dated Apr. 7, 2026.

* cited by examiner

*Primary Examiner* — Roshn K Varghese
(74) *Attorney, Agent, or Firm* — Rabin & Berdo, P.C.

(57) ABSTRACT

A semiconductor apparatus includes a semiconductor module, a substrate having a control unit that controls an operation of the semiconductor module, a busbar that allows a current to flow through the semiconductor module, and a shield arranged between at least respective opposing surfaces of the control unit and the busbar that oppose to each other.

5 Claims, 6 Drawing Sheets

SEMICONDUCTOR APPARATUS

CROSS REFERENCE TO RELATED APPLICATIONS

This application is based upon and claims the benefit of priority of the prior Japanese Patent Application No. 2022067529, filed on Apr. 15, 2022, the entire contents of which are incorporated herein by reference.

BACKGROUND OF THE INVENTION

Field of the Invention

The present invention relates to a semiconductor apparatus.

Description of the Related Art

There is a semiconductor apparatus that includes a semiconductor module including a plurality of semiconductor devices, a substrate loaded with a control unit that controls an operation of the semiconductor module, and a busbar (bus bar) that allows a current to flow through the semiconductor module.

If a distance between the control unit and the busbar is relatively short, radiation noise (an electromagnetic wave) caused by an operation of the semiconductor module is emitted toward the control unit side from the busbar. Due to an effect of the radiation noise, the control unit may malfunction.

There may be another semiconductor apparatus in which an entire substrate including a control unit is covered with a shield section. Associated techniques include Japanese Patent Laid-Open Nos. 2004-022705, 2001-250910, and 2021-141638.

However, the above-described other semiconductor apparatus has a configuration in which the entire substrate is more covered with the shield section than necessary. Accordingly, the semiconductor apparatus may increase in size and increase in manufacturing cost.

SUMMARY OF THE INVENTION

The present invention is directed to preventing a semiconductor apparatus from increasing in size and increasing in manufacturing cost while preventing a control unit from malfunctioning due to radiation noise emitted from a busbar.

According to an aspect of the present invention, a semiconductor apparatus includes a semiconductor module, a substrate loaded with a control unit that controls an operation of the semiconductor module, a busbar that allows a current to flow through the semiconductor module, and a shield section arranged between at least respective opposing surfaces of the control unit and the busbar.

According to the present invention, it is possible to prevent a semiconductor apparatus from increasing in size and increasing in manufacturing cost while preventing a control unit from malfunctioning due to radiation noise emitted from a busbar.

DETAILED DESCRIPTION OF THE PREFERRED EMBODIMENT

Figure 1A:
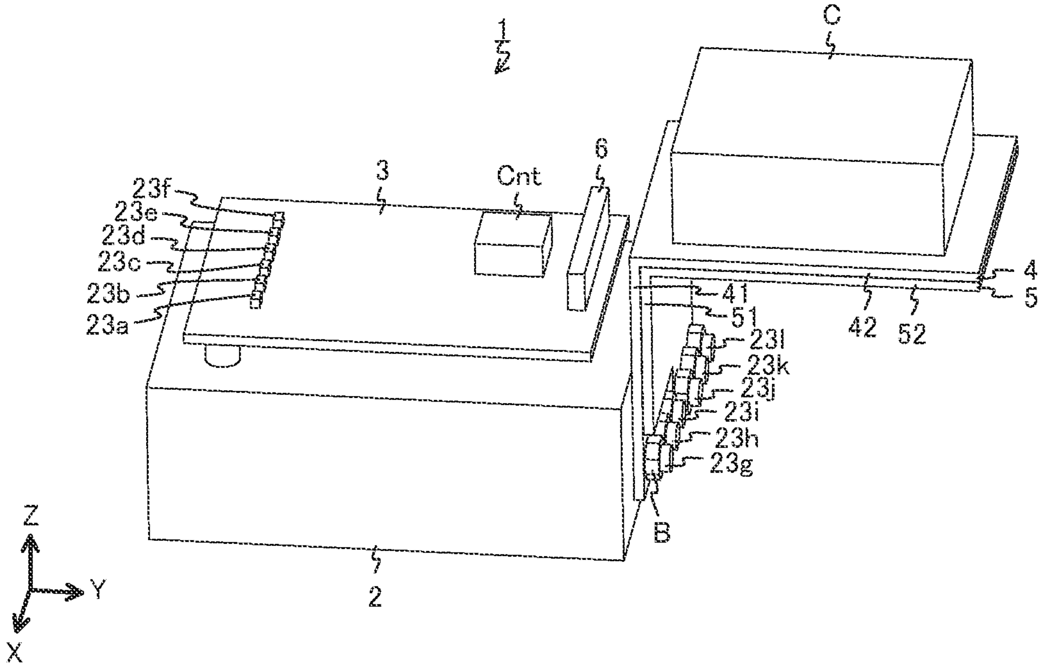
FIGS. 1A and 1B are diagrams each illustrating a semiconductor apparatus according to an embodiment.

A semiconductor apparatus according to an embodiment will be described below.

In FIGS. 1A and 1B, 3A and 3B, 4A and 4B, and 5, described below, a lateral direction of a semiconductor module, a longitudinal direction of the semiconductor module, and a height direction of the semiconductor module (a thickness direction of the semiconductor module) are respectively defined as an X-direction, a Y-direction, and a Z-direction. The X-direction, the Y-direction, and the Z-direction are perpendicular to one another, to constitute a right-handed system. The heat dissipation surface side of the semiconductor module and the opposite side thereof may be respectively referred to as the lower surface side and the upper surface side. Respective aspect ratios and magnitude relationships among members in the drawings do not necessarily match one another because they are merely illustrated in schematic views. For convenience of illustration, a case where the magnitude relationships among the members are exaggerated is also assumed.

Figure 1B:
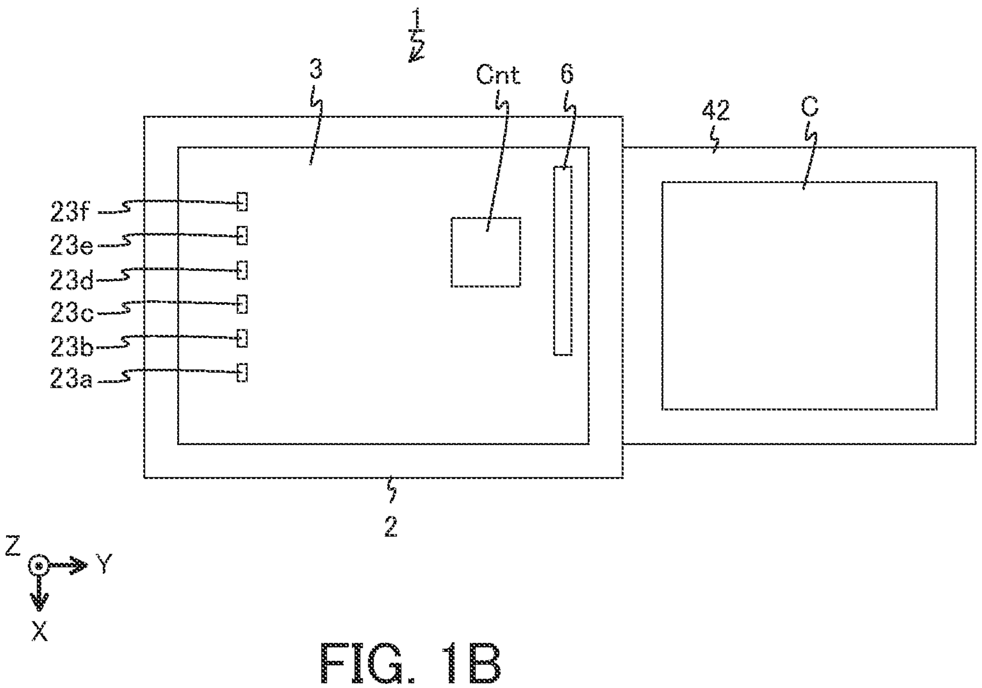

FIG. 1A is a perspective view of a semiconductor apparatus 1 according to an embodiment, and FIG. 1B is a plan view of the semiconductor apparatus 1 according to the embodiment.

The semiconductor apparatus 1 illustrated in FIGS. 1A and 1B includes a semiconductor module 2, a substrate 3 loaded with a control unit Cnt, busbars 4 and 5 each of which allows a current to flow through the semiconductor module 2, a capacitor C electrically connected to the busbars 4 and 5, and a shield section 6.

The semiconductor module 2 includes a plurality of semiconductor devices (not illustrated), and is configured as an intelligent power module (IPM) or the like. Each of the semiconductor devices is formed of a wide bandgap semiconductor substrate made of silicon (Si), silicon carbide (SiC), gallium nitride (GaN), diamond, and the like.

In the semiconductor module 2, the semiconductor devices have their respective gate terminals connected to one ends of external terminals 23*a*, 23*b*, 23*c*, 23*d*, 23*e*, and 23*f*, have their respective collector terminals connected to one ends of the external terminals 23*g*, 23*h*, and 23*i*, and have their respective emitter terminals connected to one ends of the external terminals 23*j*, 23*k*, and 23*l*. Each of the external terminals 23*a* to 23*l* is formed of a metal such as copper, a copper alloy, an aluminum alloy, or an iron alloy, and has its other end extending outside the semiconductor module 2.

The semiconductor module 2 is filled with resin (not illustrated). The resin may be composed of thermosetting resin. The resin preferably includes at least any one of epoxy resin, silicon resin, phenol resin, and melamine resin. An example of the resin is preferably epoxy resin into which an inorganic filler is mixed in terms of insulation, heat resistance, and heat dissipation.

A cooler such as a cooling fin may be provided on the lower surface side of the semiconductor module 2.

The substrate 3 is a printed circuit board or the like, and is provided on the upper surface side of the semiconductor module 2. The external terminals 23*a* to 23*f* are each electrically connected to the control unit Cnt by a wiring (not illustrated) formed on the substrate 3.

The control unit Cnt is composed of an integrated circuit (IC) or the like, and controls an operation of the semiconductor module 2. In an example illustrated in FIGS. 1A and 1B, the control unit Cnt is provided at a position relatively close to the busbar 4 on the substrate 3. A loading position of the control unit Cnt on the substrate 3 is not particularly limited.

Each of the busbars 4 and 5 is composed of a plate-shaped conductive member, and is formed in an L shape as viewed in the X-direction. The busbar 4 is connected to each of the external terminals 23*g*, 23*h*, and 23*i* with a bolt B or the like, and the busbar 5 is connected to each of the external terminals 23*j*, 23*k*, and 23*l* with a bolt B or the like. That is, the busbar 4 includes a vertical portion 41 extending toward the positive side in the Z-direction from its position to be connected to each of the external terminals 23*g*, 23*h*, and 23*i* to a position beyond the control unit Cnt and a horizontal portion 42 extending toward the positive side in the Y-direction from the position beyond the control unit Cnt. Similarly, the busbar 5 includes a vertical portion 51 extending toward the positive side in the Z-direction from its position to be connected to each of the external terminals 23*g*, 23*k*, 23*l* to a position beyond the control unit Cnt and a horizontal portion 52 extending toward the positive side in the Y-direction from the position beyond the control unit Cnt. For example, any one of gold, copper, aluminum, a gold alloy, a copper alloy, and an aluminum alloy or their combination can be used for a material for the busbars 4 and 5. A shape of the busbars 4 and 5 is appropriately changeable. For example, each of the busbars 4 and 5 may be formed in a crank shape folded in its plurality of portions, or may not be folded.

The capacitor C is an electrolytic capacitor or the like, and is arranged on the busbar 4. The capacitor C has its one terminal electrically connected to the busbar 4 and has its other terminal electrically connected to busbar 5.

The shield section 6 is composed of a plate-shaped conductive member, and is arranged between respective opposing surfaces of the control unit Cnt and each of the busbars 4 and 5 on the substrate 3 (between a side surface on the positive side in the Y-direction of the control unit Cnt and each of the vertical portions 41 and 51). The shield section 6 may be configured by plating plate-shaped resin with a conductive material. Alternately, the shield section 6 may be composed of plate-shaped resin containing a magnetic material. When the shield section 6 is loaded onto the substrate 3, the shield section 6 may be loaded onto the substrate 3 in the same process as a process for loading the control unit Cnt onto the substrate 3, or the shield section 6 may be loaded onto the substrate 3 in a different process from the process for loading the control unit Cnt onto the substrate 3. The shield section 6 is bonded to the substrate 3 with a solder, an adhesive, or the like. A distance between the shield section 6 and the control unit Cnt is set to any value.

A height (a length in the Z-direction) of the shield section 6 is more than a height (a length in the Z-direction) of the control unit Cnt, and a width (a length in the X-direction) of the shield section 6 is more than a width (a length in the X-direction) of the control unit Cnt. A thickness (a length in the Y-direction) of the shield section 6 is set to several millimeters, for example.

Figure 2:
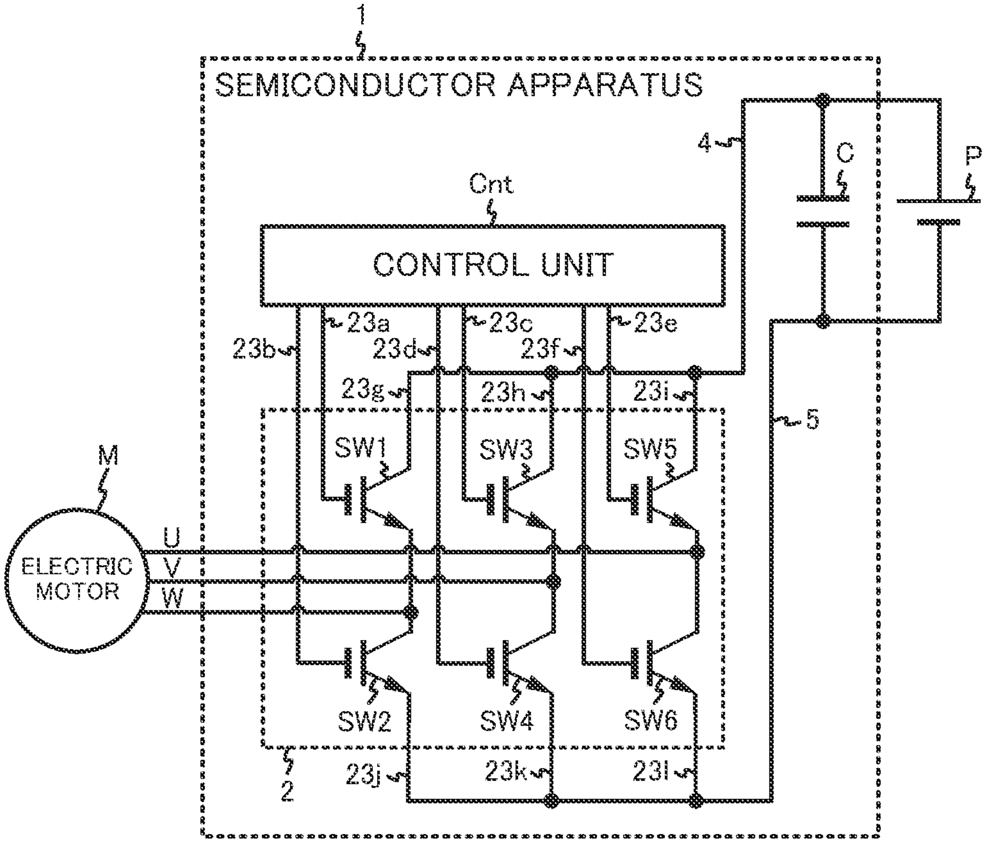
FIG. 2 is a diagram illustrating an application example of the semiconductor apparatus according to the embodiment.

FIG. 2 is a diagram illustrating an application example of the semiconductor apparatus 1 according to the embodiment. The same components as the components illustrated in FIGS. 1A and 1B are assigned the same reference numerals, and description thereof is omitted in FIG. 2.

The semiconductor apparatus 1 illustrated in FIG. 2 is applied as an inverter that converts direct current power supplied from a power supply P into alternating current power to drive an electric motor M.

That is, the semiconductor module 2 illustrated in FIG. 2 includes switches SW1 to SW6 as the above-described plurality of semiconductor devices. Each of the switches SW1 to SW6 is an insulated gate bipolar transistor (IGBT), for example. Each of the switches SW1, SW3, and SW5 has its collector terminal connected to a positive electrode terminal of the power supply P via one terminal of the capacitor C, and each of the switches SW2, SW4, and SW6 has its emitter terminal connected to a negative electrode terminal of the power supply P via the other terminal of the capacitor C. A node between an emitter terminal of the switch SW1 and a collector terminal of the switch SW2 is connected to a U-phase input terminal of an electric motor M, a node between an emitter terminal of the switch SW3 and a collector terminal of the switch SW4 is connected to a V-phase input terminal of the electric motor M, and a node between an emitter terminal of the switch SW5 and a collector terminal of the switch SW6 is connected to a W-phase input terminal of the electric motor M. The switch SW1 has its gate terminal connected to the control unit Cnt via the external terminal 23*a*, the switch SW2 has its gate terminal connected to the control unit Cnt via the external terminal 23*b*, and the switch SW3 has its gate terminal connected to the control unit Cnt via the external terminal 23*c*. The switch SW4 has its gate terminal connected to the control unit Cnt via the external terminal 23*d*, the switch SW5 has its gate terminal connected to the control unit Cnt via the external terminal 23*e*, and the switch SW6 has its gate terminal connected to the control unit Cnt via the external terminal 23*f*.

A diode may be connected in parallel with each of the switches SW1 to SW6. Each of the switches SW1 to SW6 may be composed of a metal oxide semiconductor field effect transistor (MOSFET) or the like.

The capacitor C smooths a voltage to be outputted to the semiconductor module 2 from the power supply P.

The control unit Cnt turns on or off each of the switches SW1 to SW6. When each of the switches SW1 to SW6 is turned on or off, a DC voltage outputted from the power supply P is converted into three AC voltages that differ in phase by 120 degrees. When the AC voltages are respectively applied to the U-phase input terminal, the V-phase input terminal, and the W-phase input terminal of the electric motor M, the electric motor M is driven.

When each of the switches SW1 to SW6 is turned on or off, switching noise is superimposed on a current flowing through each of the busbars 4 and 5, and radiation noise is emitted from each of the busbars 4 and 5 to a space around the busbars 4 and 5.

If a distance between the control unit Cnt and each of the busbars 4 and 5 is relatively short, the control unit Cnt is easily affected by the radiation noise so that the control unit Cnt may malfunction.

Figure 3A:
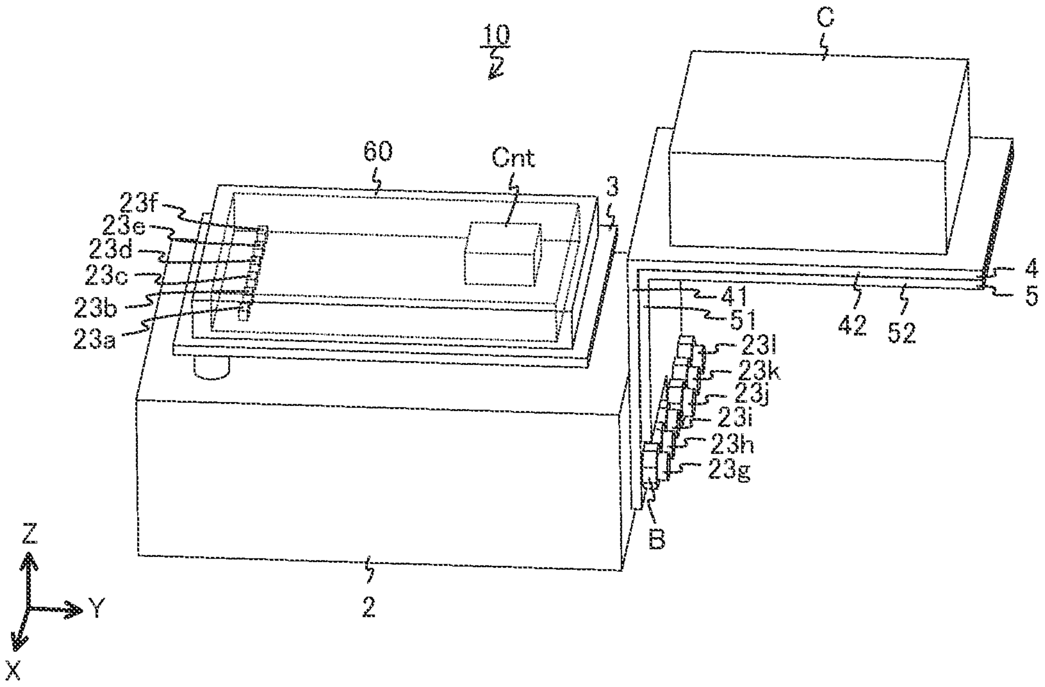
FIGS. 3A and 3B are diagrams each illustrating a comparative example of the semiconductor apparatus according to the embodiment.
Figure 3B:
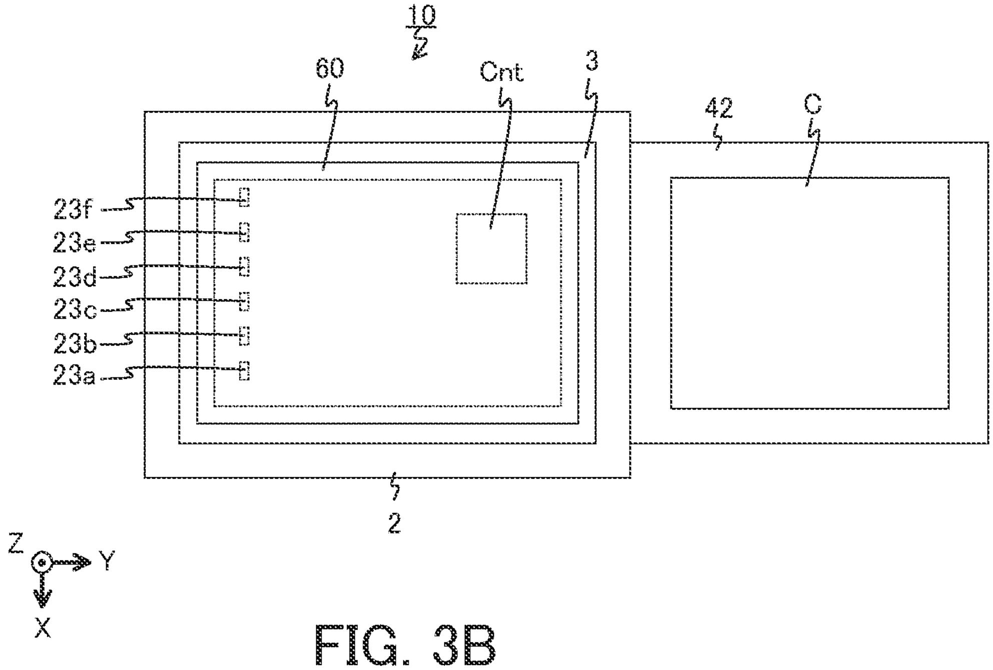

To address that case, an entire upper surface of a substrate 3 might be covered with a shield section 60, like in a semiconductor apparatus 10 illustrated in FIGS. 3A and 3B. However, when not only a control unit Cnt but also components (external terminals 23*a* to 23*f*, an amplification circuit (not illustrated), etc.) other than the control unit Cnt are thus covered with the shield section 60, the shield section 60 increases in size. Accordingly, it is likely that the semiconductor apparatus 10 increases in size and increases in manufacturing cost.

On the other hand, in the semiconductor apparatus 1 according to the embodiment illustrated in FIGS. 1A and 1B, the shield section 6 is arranged on the substrate 3 to oppose only the side surface on the positive side in the Y-direction of the control unit Cnt. When the control unit Cnt, the busbar 4, and the busbar 5 are arranged in this order toward the positive side in the Y-direction from the negative side in the Y-direction, as illustrated in FIGS. 1A and 1B, a side surface, which is most easily affected by radiation noise emitted from each of the busbars 4 and 5, among four side surfaces of the control unit Cnt is the side surface on the positive side in the Y-direction. Accordingly, the shield section 6 is provided only in the vicinity of the side surface on the positive side in the Y-direction of the control unit Cnt on the substrate 3.

Thus, the semiconductor apparatus 1 according to the embodiment illustrated in FIGS. 1A and 1B has a configuration in which the shield section 6 is arranged on the substrate 3 to oppose only the one side surface of the control unit Cnt, that is, has a configuration in which the shield section 6 of a minimum size required to reduce or block radiation noise emitted from each of the busbars 4 and 5 is arranged on the substrate 3. Accordingly, the shield section 6 can be more prevented from increasing than in a configuration in which not only the control unit Cnt but also the other components are covered with the shield section 60, like in the semiconductor apparatus 10 illustrated in FIGS. 3A and 3B. As a result, the semiconductor apparatus 1 can be prevented from increasing in size and increasing in manufacturing cost.

In the semiconductor apparatus 1 according to the embodiment, radiation noise emitted to the control unit Cnt from each of the busbars 4 and 5 can be reduced or blocked by the shield section 6, thereby making it possible to prevent the control unit Cnt from malfunctioning due to the radiation noise.

In the semiconductor apparatus 1 according to the embodiment, the control unit Cnt can be prevented from malfunctioning due to radiation noise emitted from each of the busbars 4 and 5. This make it possible, for example, to prevent occurrence of the case where soft shutdown processing is not normally performed, which is a processing to be performed when an upper arm (the switches SW1, SW3, and SW5) and a lower arm (the switches SW2, SW4, and SW6) of the semiconductor module 2 are simultaneously turned on (control to gradually reduce a current flowing through each of the semiconductor devices by gradually reducing a duty ratio of a driving signal inputted to the gate terminal of each of the semiconductor devices).

Modified Example 1

Figure 4A:
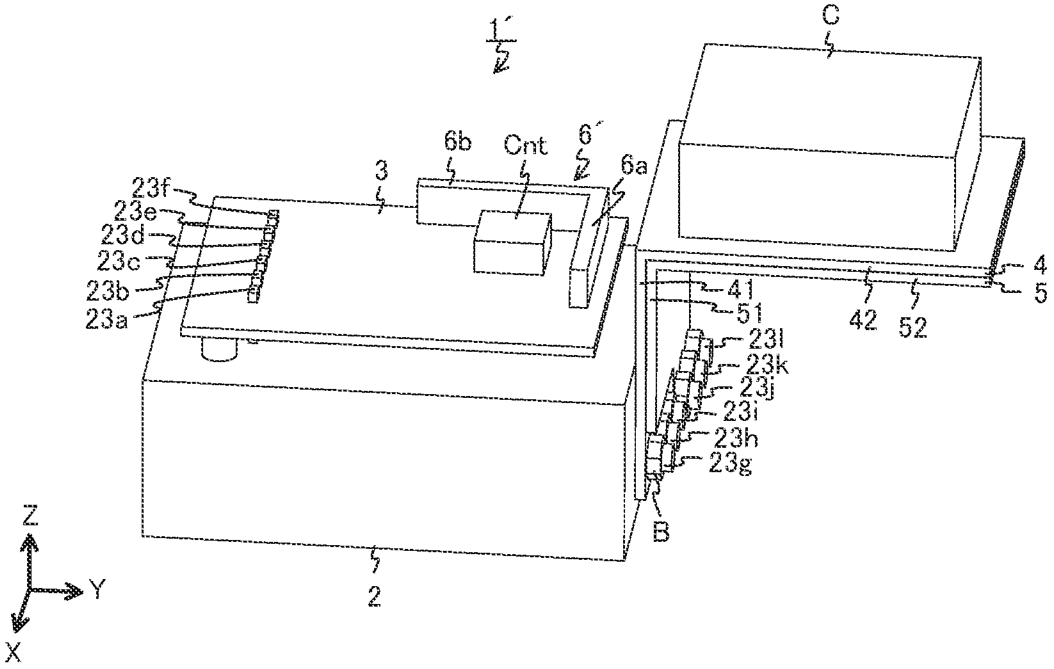
FIGS. 4A and 4B are diagrams each illustrating a modified example 1 of the semiconductor apparatus according to the embodiment.
Figure 4B:
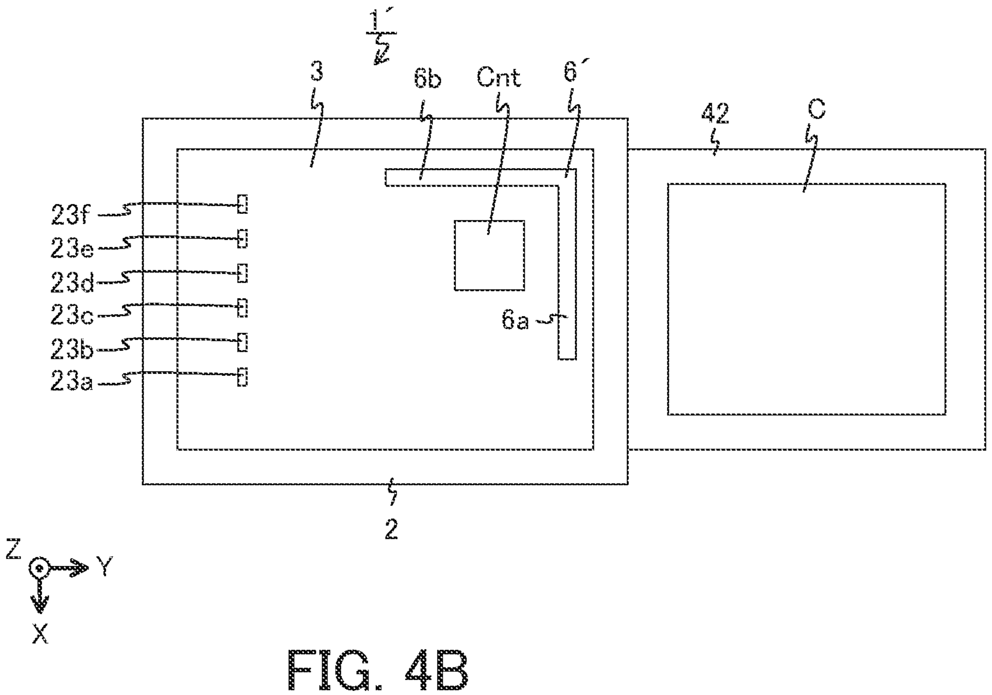

FIGS. 4A and 4B are diagrams each illustrating a modified example 1 of the semiconductor apparatus according to the embodiment. FIG. 4A is a perspective view of a semiconductor apparatus 1', and FIG. 4B is a plan view of the semiconductor apparatus 1'. In FIGS. 4A and 4B, the same components as the components illustrated in FIGS. 1A and 1B are assigned the same reference numerals, and description thereof is omitted.

The semiconductor apparatus 1' illustrated in FIGS. 4A and 4B differs from the semiconductor apparatus 1 illustrated in FIGS. 1A and 1B in that a shield section 6' is arranged on a substrate 3 to oppose two adjacent side surfaces of a control unit Cnt. That is, the shield section 6' includes a plate-shaped shield member 6*a* opposing the side surface on the positive side in the Y-direction of the control unit Cnt and a plate-shaped shield member 6*b* opposing the side surface on the negative side in the X-direction of the control unit Cnt and is formed such that the shield member 6*a* and the shield member 6*b* form a right angle or substantially a right angle (an L shape as viewed in the Z-direction). In other words, the shield member 6*a* is arranged between respective opposing surfaces of the control unit Cnt and each of the busbars 4 and 5 (between the side surface on the positive side in the Y-direction of the control unit Cnt and each of vertical portions 41 and 51). The shield member 6*b* is arranged between respective opposing surfaces of the control unit Cnt and a member (not illustrated) that reflects radiation noise emitted from each of the busbars 4 and 5 (between the side surface on the negative side in the X-direction of the control unit Cnt and the member (not illustrated) that reflects the radiation noise).

The shield section 6' may be composed of a conductive member, like the shield section 6. The shield section 6' may be configured by plating resin with a conductive material. The shield section 6' may be composed of resin containing a magnetic material.

When the shield section 6' is loaded onto the substrate 3, the shield section 6' may be loaded onto the substrate 3 in the same process as a process for loading the control unit Cnt onto the substrate 3, or the shield section 6' may be loaded onto the substrate 3 in a different process from the process for loading the control unit Cnt onto the substrate 3. The shield section 6' is bonded to the substrate 3 with a solder, an adhesive, or the like.

Thus, in the semiconductor apparatus 1' illustrated in FIGS. 4A and 4B, radiation noise directed toward the side surface on the positive side in the Y-direction of the control unit Cnt from each of the busbars 4 and 5 can be reduced or blocked by the shield member 6*a*, and radiation noise emitted from each of the busbars 4 and 5, then reflected on a member (not illustrated) provided in the vicinity of the side surface on the negative side in the X-direction of the control unit Cnt, and directed toward the side surface on the negative side in the X-direction of the control unit Cnt can be reduced or blocked by the shield member 6*b*. This makes it possible to further suppress an influence of the radiation noise on the control unit Cnt, thereby making it possible to more prevent the control unit Cnt from malfunctioning.

In the semiconductor apparatus 1' illustrated in FIGS. 4A and 4B has a size in which the shield section 6' opposes only the two adjacent side surfaces of the control unit Cnt. Accordingly, the shield section 6' can be more prevented from increasing than in a configuration in which not only the control unit Cnt but also the other components are covered with the shield section 60, like in the semiconductor apparatus 10 illustrated in FIGS. 3A and 3B. Accordingly, the semiconductor apparatus 1' can be prevented from increasing in size and increasing in manufacturing cost.

The shield section 6' may further include a plate-shaped shield section opposing a side surface on the negative side in the Y-direction of the control unit Cnt and a plate-shaped shield section opposing a side surface on the positive side in the X-direction of the control unit Cnt in addition to the shield members 6*a* and 6*b*.

This makes it possible to further suppress an influence of the radiation noise on the control unit Cnt, thereby making it possible to more prevent the control unit Cnt from malfunctioning.

Even if the shield section 6' is formed in a rectangular frame shape to oppose all the side surfaces of the control unit Cnt, the shield section 6' can be more prevented from increasing than in a configuration in which not only the control unit Cnt but also the other components are covered with the shield section 60, like in the semiconductor apparatus 10 illustrated in FIGS. 3A and 3B. Accordingly, the semiconductor apparatus 1' can be prevented from increasing in size and increasing in manufacturing cost.

Modified Example 2

Figure 5:
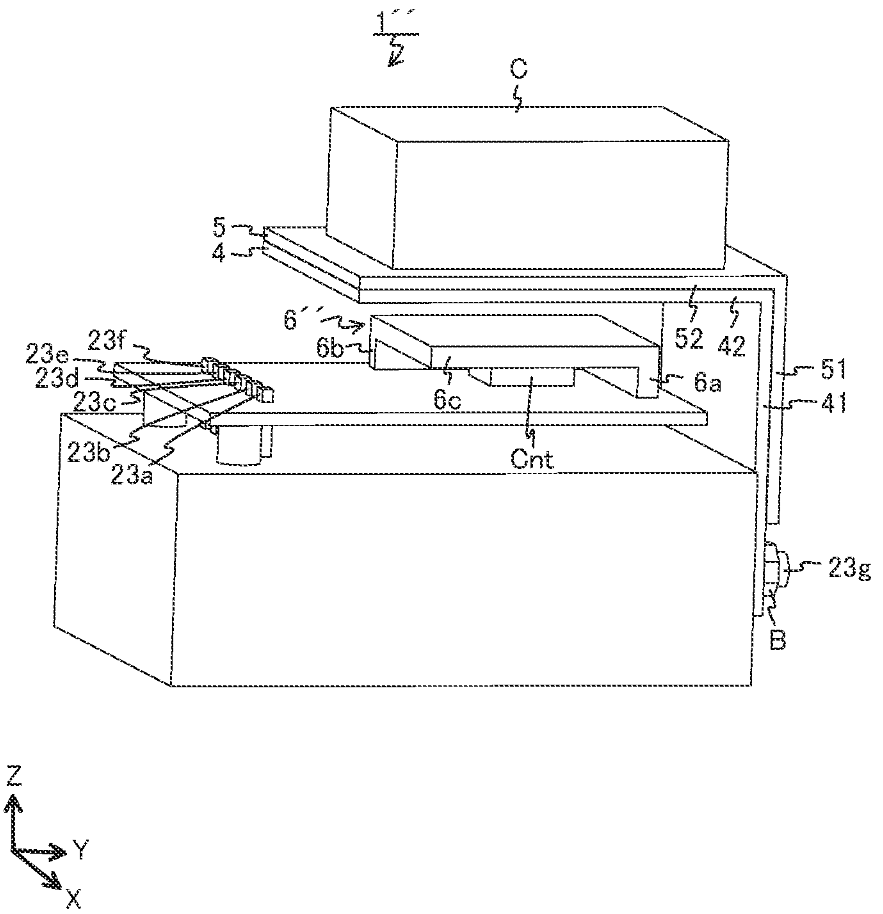
FIG. 5 is a diagram illustrating a modified example 2 of the semiconductor apparatus according to the embodiment.

FIG. 5 is a diagram illustrating a modified example 2 of the semiconductor apparatus according to the embodiment. In FIG. 5, the same components as the components illustrated in FIGS. 4A and 4B are assigned the same reference numerals, and description thereof is omitted.

A semiconductor apparatus 1" illustrated in FIG. 5 differs from the semiconductor apparatus 1 illustrated in FIGS. 4A and 4B in that each of a horizontal portion 42 of a busbar 4 and a horizontal portion 52 of a busbar 5 extends toward not the positive side in the Y-direction but the negative side in the Y-direction so that a distance between the busbar 4 and an upper surface of the control unit Cnt is relatively short and in that a shield section 6" is formed to oppose not only two adjacent side surfaces of the control unit Cnt but also the upper surface of the control unit Cnt. That is, the shield section 6" includes a plate-shaped shield member 6*c* that covers the upper surface of the control unit Cnt in addition to shield members 6*a* and 6*b*. In other words, the shield member 6*a* is arranged between respective opposing surfaces of the control unit Cnt and each of the busbars 4 and 5 (between the side surface on the positive side in the Y-direction of the control unit Cnt and each of the vertical portions 41 and 51). The shield member 6*b* is arranged between respective opposing surfaces of the control unit Cnt and a member (not illustrated) that reflects radiation noise emitted from each of the busbars 4 and 5 (between the side surface on the negative side in the X-direction of the control unit Cnt and the member (not illustrated) that reflects the radiation noise). The shield member 6*c* is arranged between respective opposing surfaces of the control unit Cnt and each of the busbars 4 and 5 (between the upper surface of the control unit Cnt and each of the horizontal portions 42 and 52).

The shield section 6" may be composed of a conductive member, like the shield section 6 and the shield section 6'. The shield section 6" may be configured by plating resin with a conductive material. The shield section 6" may be composed of resin containing a magnetic material.

When the shield section 6" is loaded onto the substrate 3, the shield section 6" may be loaded onto the substrate 3 in the same process as a process for loading the control unit Cnt onto the substrate 3, or the shield section 6" may be loaded onto the substrate 3 in a process succeeding the process for loading the control unit Cnt onto the substrate 3. The shield section 6" is bonded to the substrate 3 with a solder, an adhesive, or the like.

Thus, in the semiconductor apparatus 1" illustrated in FIG. 5, radiation noise directed toward the side surface on the positive side in the Y-direction of the control unit Cnt from each of the busbars 4 and 5 can be reduced or blocked by the shield member 6*a*, and radiation noise emitted from each of the busbars 4 and 5, then reflected on a member (not illustrated) provided in the vicinity of the side surface on the negative side in the X-direction of the control unit Cnt, and directed toward the side surface on the negative side in the X-direction of the control unit Cnt can be reduced or blocked by the shield member 6*b*, and radiation noise directed toward the upper surface of the control unit Cnt from the busbars 4 and 5 can be reduced or blocked by the shield member 6*c*. This makes it possible to further suppress an influence of the radiation noise on the control unit Cnt, thereby making it possible to more prevent the control unit Cnt from malfunctioning.

In the semiconductor apparatus 1" illustrated in FIG. 5, the shield section 6" is formed to oppose the two adjacent side surfaces and the upper surface of the control unit Cnt. Accordingly, the shield section 6" can be more prevented from increasing than in a configuration in which not only the control unit Cnt but also the other components are covered with the shield section 60, like in the semiconductor apparatus 10 illustrated in FIGS. 3A and 3B. Accordingly, the semiconductor apparatus 1" can be prevented from increasing in size and increasing in manufacturing cost.

The shield section 6" may further include a plate-shaped shield section opposing a side surface on the negative side in the Y-direction of the control unit Cnt and a plate-shaped shield section opposing a side surface on the positive side in the X-direction of the control unit Cnt in addition to the shield members 6*a* to 6*c*. That is, the shield section 6" may be configured in such a shape as to cover only the control unit Cnt.

This makes it possible to further suppress an influence of the radiation noise on the control unit Cnt, thereby making it possible to more prevent the control unit Cnt from malfunctioning.

Even if the shield section 6" is formed to cover only the control unit Cnt, the shield section 6" can be more prevented from increasing than in a configuration in which not only the control unit Cnt but also the other components are covered with the shield section 60, like in the semiconductor apparatus 10 illustrated in FIGS. 3A and 3B. Accordingly, the semiconductor apparatus 1" can be prevented from increasing in size and increasing in manufacturing cost.

As to Vehicle Including Semiconductor Apparatus According to Embodiment

Then, a vehicle including the semiconductor apparatus according to the embodiment will be described.

Figure 6:
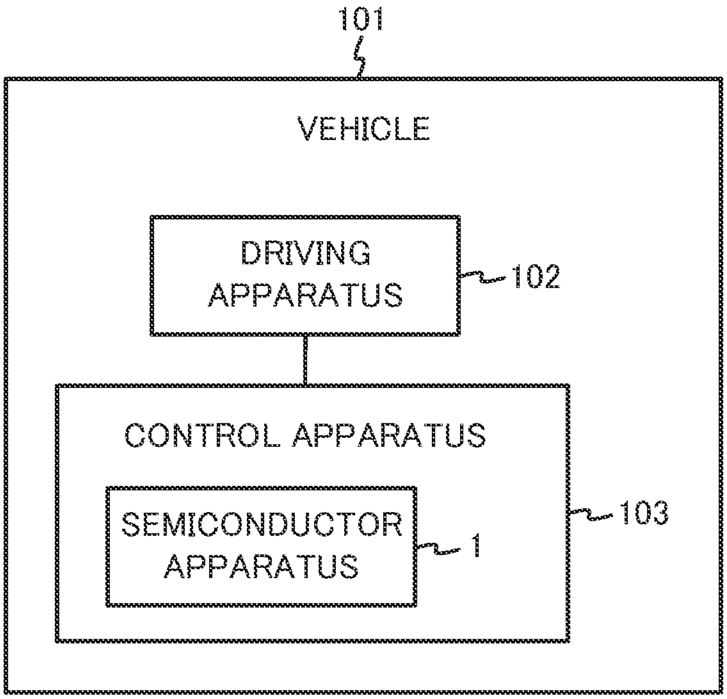
FIG. 6 is a diagram illustrating a vehicle including the semiconductor apparatus according to the embodiment.

FIG. 6 is a diagram illustrating an example of a vehicle including the semiconductor apparatus according to the embodiment. A vehicle 101 illustrated in FIG. 6 may be an electric vehicle using power of an electric motor M or a hybrid vehicle using power of the electric motor M and power of an engine (internal combustion engine).

The vehicle 101 includes a driving apparatus 102 and a control apparatus 103.

The driving apparatus 102 may be composed of at least one of an engine, an electric motor M, and a hybrid of an engine and an electric motor M, for example.

The control apparatus 103 includes a semiconductor apparatus 1, and the semiconductor apparatus 1 controls an operation of the driving apparatus 102. The semiconductor apparatus provided in the control apparatus 103 may be the above-described semiconductor apparatus 1' or the above-described semiconductor apparatus 1".

Although the above-described embodiment and modified examples 1 and 2 have been described, the present invention may be an overall or partial combination of the above-described embodiment and modified examples 1 and 2 as another embodiment.

The present embodiment is not limited to the above-described embodiment and modified examples 1 and 2, but various changes, replacements, and modifications may be made without departing from the spirit of the technical idea. Further, if the technical idea can be implemented using another method by advancement of technology or derivative other technologies, the technical idea may be implemented using the method. Therefore, the claims cover all implementations that can be included in the scope of the technical idea.

As to Feature Points of Embodiment

Then, feature points in the above-described embodiment are summarized.

A semiconductor apparatus according to the above-described embodiment includes a semiconductor module, a substrate loaded with a control unit that controls an operation of the semiconductor module, a busbar that allows a current to flow through the semiconductor module, and a shield section arranged between at least respective opposing surfaces of the control unit and the busbar.

In the semiconductor apparatus according to the above-described embodiment, the shield section is arranged to oppose a part or the whole of the surface opposing the busbar in the control unit.

In the semiconductor apparatus according to the above-described embodiment, the shield section includes a first shield member arranged between the respective opposing surfaces of the control unit and the busbar and a second shield member arranged between respective opposing surfaces of the control unit and a member that reflects radiation noise emitted from the busbar.

The vehicle according to the above-described embodiment includes the above-described semiconductor apparatus.

As described above, the semiconductor apparatus according to the present embodiment has an effect of being able to prevent the semiconductor apparatus from increasing in size and increasing in manufacturing cost while preventing the control unit from malfunctioning due to radiation noise emitted from the busbar, and is usable as a control apparatus that controls a driving apparatus in the vehicle.

REFERENCE SIGNS LIST

1, 10, 1', 1" semiconductor apparatus
2 semiconductor module
3 substrate
4, 5 busbar
6, 60, 6', 6" shield section
6*a*, 6*b*, 6*c* shield member
23*a* to 23*l* external terminal
101 vehicle
102 driving apparatus
103 control apparatus
SW1 to SW6 switch
P power supply
C capacitor
Cnt control unit
M electric motor

What is claimed is:

1. A semiconductor apparatus, comprising:
- a semiconductor module;
- a substrate having a control unit disposed thereon, the control unit being configured to control an operation of the semiconductor module;
- a busbar having a flat plate shape with first and second main surfaces opposite to each other in a thickness direction of the busbar, and being configured to allow a current to flow through the semiconductor module, the busbar being arranged such that the first main surface of the busbar faces and is parallel to a first surface of the control unit; and
- a shield having a plate shape and having main surfaces opposite to each other in a thickness direction thereof, the shield being arranged between the control unit and the busbar, such that the main surfaces of the shield respectively face and are parallel to the first main surface of the busbar and the first surface of the control unit, so as to overlap each other when viewed from the thickness direction of the busbar, wherein
- the busbar includes a first portion that extends in parallel to the first surface of the control unit and a second portion that is bent in a direction toward the control unit so as to extend in parallel to a second surface of the control unit, the first and second surfaces of the control unit forming an acute angle between them; and
- the shield includes a first shield member arranged between the first surface of the control unit and a surface of the first portion of the busbar, which face each other, and a second shield member arranged between, and parallel to, the second surface of the control unit and a surface of the second portion of the busbar.

2. The semiconductor apparatus according to claim 1, wherein
- the main surfaces of the shield face a part or all of the first surface of the control unit.

3. The semiconductor apparatus according to claim 1, wherein the shield includes
- a first shield member arranged between the first surface of the control unit and the first main surface of the busbar that face each other, and
- a second shield member arranged to face the second surface of the control unit.

4. A vehicle comprising the semiconductor apparatus according to claim 1.

5. The semiconductor apparatus according to claim 1, wherein the shield is arranged adjacent to the control unit without any electrical component intervening between them.

* * * * *